United States Patent
Ionescu et al.

(10) Patent No.: US 6,891,161 B2
(45) Date of Patent: May 10, 2005

(54) PIXEL STRUCTURE AND AN ASSOCIATED METHOD OF FABRICATING THE SAME

(75) Inventors: Adrian C. Ionescu, Long Beach, CA (US); Philip Earl Howard, Hacienda Heights, CA (US)

(73) Assignee: DRS Sensors & Targeting Systems, Inc., Anaheim, CA (US)

( * ) Notice: Subject to any disclaimer, the term of this patent is extended or adjusted under 35 U.S.C. 154(b) by 115 days.

(21) Appl. No.: 10/346,213

(22) Filed: Jan. 17, 2003

(65) Prior Publication Data

US 2004/0140428 A1 Jul. 22, 2004

(51) Int. Cl.⁷ ................................................. G01J 5/00
(52) U.S. Cl. .............................. 250/338.4; 250/338.1; 250/332
(58) Field of Search ......................... 250/338.4, 338.1, 250/332, 338.3, 370.01, 370.08

(56) References Cited

U.S. PATENT DOCUMENTS

| | | | |
|---|---|---|---|
| 5,480,839 A | | 1/1996 | Ezawa et al. |
| 5,580,813 A | | 12/1996 | Hachisuka et al. |
| 5,681,661 A | | 10/1997 | Kelly |
| 5,831,219 A | | 11/1998 | Kobayashi et al. |
| 5,930,594 A | | 7/1999 | Vilain |
| 5,949,119 A | | 9/1999 | Vilain |
| 6,034,374 A | * | 3/2000 | Kimura et al. .......... 250/370.08 |
| 6,046,485 A | | 4/2000 | Cole et al. |
| 6,144,030 A | | 11/2000 | Ray et al. |
| 6,489,613 B1 | * | 12/2002 | Mori et al. ............... 250/338.1 |
| 6,495,829 B1 | * | 12/2002 | Oda ....................... 250/339.02 |
| 6,667,479 B2 | * | 12/2003 | Ray ......................... 250/338.1 |
| 6,710,344 B2 | * | 3/2004 | Oda ......................... 250/338.1 |

* cited by examiner

*Primary Examiner*—Albert Gagliardi
(74) *Attorney, Agent, or Firm*—Norris, McLaughlin & Marcus (57) ABSTRACT

A pixel structure, which forms one element of a focal plane array, includes a bolometer having a detector and an insulator. The detector that is made from a material that absorbs incident thermal radiation and has an electrical resistance that varies in response to changes in the temperature of the material. The insulator has a plurality of serpentine legs disposed completely underneath the detector so that the insulator extends between the detector and the substrate. And the insulator supports the detector in a spaced-apart relationship with respect to the substrate to thermally isolate the detector from the substrate. To further improve the performance of the bolometer, the bolometer includes a resonant layer between the detector and the insulator. The resonant layer is disposed such that areas defined between the detector and the resonant layer, and between the resonant layer and the insulator, form first and second resonant cavities, respectively.

30 Claims, 6 Drawing Sheets

PIXEL STRUCTURE AND AN ASSOCIATED METHOD OF FABRICATING THE SAME

FIELD OF THE INVENTION

The present invention relates generally to infrared detectors and methods of fabricating the same and, more particularly, to the pixel structure of a bolometer-based focal plane array and methods of fabricating the same.

BACKGROUND OF THE INVENTION

Infrared detectors are used in a variety of applications to provide an electrical output which is a useful measure of the incident infrared radiation. For example, quantum detectors are one type of infrared detector that are often used for night vision purposes in a variety of military, industrial and commercial applications. Quantum detectors generally operate at cryogenic temperatures and therefore require a cryogenic cooling apparatus. As a result, quantum detectors that operate at cryogenic temperatures can have a relatively complex design and generally consume significant amounts of energy.

Another type of infrared detector is a thermal detector. Thermal detectors are typically uncooled and therefore generally operate at room temperature. One type of thermal detector that has been developed and is becoming increasingly popular is a microbolometer-based, uncooled focal plane array. A focal plane array generally includes a plurality of pixel structures, each of which includes a bolometer disposed upon a common substrate. Each bolometer includes a transducer element that has an electrical resistance that varies as a result of temperature changes produced by the incident infrared radiation. By detecting changes in the electrical resistance, a measure of the incident infrared radiation can be obtained. Since the design of a bolometer-based uncooled focal plane array is generally less complex than cryogenically cooled quantum detectors and since these uncooled focal plane arrays generally require significantly less energy than cryogenically cooled quantum detectors, bolometer-based uncooled focal plane arrays are being increasingly utilized.

Each pixel structure of a conventional uncooled focal plane array has a bolometer that includes an absorber element for absorbing infrared radiation and an associated transducer element having an electrical resistance that varies as its temperature correspondingly varies. In operation, infrared radiation incident upon the absorber element will heat the absorber element. Since the absorber element and the transducer element are in thermal contact, the heating of the absorber element will correspondingly heat the transducer element, thereby causing the electrical resistance of the transducer element to change in a predetermined manner. By measuring the change in electrical resistance of the transducer element, such as by passing a known current through the transducer element, a measure of the incident radiation can be obtained.

In order to permit the bolometer to be responsive to changes in the incident infrared radiation, the bolometer is generally designed to minimize thermal loss to the substrate. Thus, the bolometers of conventional focal plane arrays have separated the absorber and the transducer elements from the substrate so as to substantially thermally decouple the relatively massive substrate from the pixel. In this regard, each bolometer generally includes a thermal isolation structure (TIS) having two or more legs that support the absorber and transducer elements above the substrate, with the length of the legs scaling directly with the level of thermal isolation between the absorber/transducer and the substrate. The TIS connects the absorber and transducer elements to pillars or the like that support the absorber and transducer elements above the substrate. In conventional bolometers, however, the legs of the TIS generally do not extend underneath the absorber and transducer. Instead, the legs typically extend out from edge portions of the absorber and transducer. This is a drawback in conventional bolometers because for a given pixel structure size, the available area must be divided between the TIS, and the absorber and transducer, which limits the length of the legs and, in turn, the thermal isolation of the bolometer.

In bolometers where the absorber and transducer elements are separate layers, in order to provide thermal contact between the absorber and the transducer elements while electrically insulating the transducer element from the absorber element, the bolometer also generally includes a thermally conductive, electrically insulating layer disposed between the absorber element and the transducer element. In addition, the bolometer typically includes another insulating layer disposed on the surface of the bolometer facing the substrate which serves to structurally support the other layers and to protect the other layers during the fabrication process. See, for example, U.S. Pat. Nos. 5,286,976; 5,288,649 and 5,367,167 which describe the pixel structures of conventional bolometer-based focal plane arrays, the contents of each of which are incorporated herein by reference.

In order to further improve the performance of conventional pixel structures, each bolometer can include a reflector disposed upon the surface of the substrate underlying the absorber and transducer elements. As such, infrared radiation that is incident upon the bolometer, but that passes through and is not absorbed by the absorber element, will be reflected by the reflector back towards the absorber element. At least a portion of the reflected radiation will therefore be absorbed by the absorber element during its second pass through the absorber element, thereby increasing the percentage of the incident radiation that is absorbed by the absorber element.

In operation, infrared radiation incident upon the pixel structure will be absorbed by the absorber element of the bolometer and the heat generated by the absorbed radiation will be transferred to the transducer element. As the transducer element heats in response to the absorbed radiation, the electrical resistance of the transducer element will change in a predetermined manner. In order to monitor the change in resistance of the transducer element and, therefore, to indirectly measure the infrared radiation incident upon the bolometer of the pixel structure, circuitry is generally formed upon the underlying substrate. The circuitry is generally electrically connected to the transducer element via a pair of conductive paths or traces defined by or upon the legs, pillars or the like that support the absorber and transducer elements above the surface of the substrate. By passing a known current through the transducer element, the change in electrical resistance of the transducer element can be measured and a corresponding measure of the incident infrared radiation can be determined.

While bolometer-based focal plane arrays having a plurality of pixel structures as described above are extremely useful, these conventional focal plane arrays have several disadvantages. Most notably, for the bolometer of each pixel structure, the characteristics of the absorber element and the transducer element cannot be separately optimized since the absorber and transducer elements are included within the same multilayer structure that is supported above the surface of the substrate. In this regard, in order to optimize the performance of the bolometer of a focal plane array, the absorption characteristics of the bolometer should be maximized while the thermal loss to the substrate should be minimized. In particular, the absorption characteristics are preferably maximized and the thermal loss to the substrate is preferably minimized in order to increase the sensitivity and, thus, thermal resistance, of the bolometer.

Since the pixel structures are generally disposed in an array, it is desirable that the absorber layer of the bolometer of each pixel structure be as large as possible and approximate the overall size of the pixel structure as closely as possible in order to maximize the fill factor. Unfortunately, the legs, pillars or the like that support the absorber and transducer elements of conventional bolometers above the surface of the substrate generally extend from edge portions of the absorber and transducer elements to the substrate. Due to the design of these conventional bolometers, the absorber layer is therefore typically unable to completely cover the legs, pillars or the like.

While conventional focal plane arrays having pixel structures with bolometers as described above have been sufficient for most applications in the past, these conventional focal plane arrays may be unable to meet the heightened requirements proposed by a number of future applications that demand increased performance and perhaps decreased size. In particular, as the pixel density and performance requirements of focal plane arrays are increased, the compromises that have been made in the past in order to balance the absorption characteristics of a conventional bolometer become unworkable. In addition, concerns relating to the costs to manufacture focal plane arrays and the size of the resulting focal plane arrays are driving focal plane arrays to be even smaller, thereby correspondingly placing even more importance upon maximizing the fill factor of the pixel structures. For the reasons described above, conventional focal plane arrays having a plurality of pixel structures, each of which includes a bolometer having absorber and transducer supported above the surface of a substrate, do not appear to be able to meet the performance requirements demanded by some modern applications.

One approach designed to overcome most of the aforementioned shortcomings of conventional focal plane arrays is described in U.S. Pat. No. 6,307,194 (the '194 patent) and assigned to DRS Sensors & Targeting Systems, the assignee of the present application. The contents of the '194 patent are incorporated in its entirety herein by reference. The pixel structure of the '194 patent includes a bolometer having a transducer and an absorber that have been spaced-apart, preferably disposed in different planes and separated by a gap so as to permit the transducer and the absorber to be separately optimized. As such, the absorption characteristics of the bolometer can be maximized, while concurrently minimizing the thermal loss to the substrate. This combination of maximizing the absorption characteristics and minimizing the thermal loss, in turn, translates into a more sensitive bolometer and an increase in the thermal resistance of the bolometer. In order to support the absorber in a spaced-apart relationship from the transducer, the bolometer of the '194 patent preferably includes a post extending between the transducer and the absorber. The post is preferably thermally conductive to thereby maintain thermal contact between the absorber and the transducer. As such, the absorber can transfer thermal energy via the post to the transducer in response to the absorbed radiation. In order to further improve the performance of the bolometer, the bolometer can also include a reflector disposed upon the substrate and underlying the transducer.

As disclosed in the '194 patent, since the absorber and the transducer of the bolometer are spaced-apart from one another, the absorber and the transducer can be separately designed in order to optimize the performance of the pixel structure. For example, in order to increase the absorption characteristics of the pixel structure, the absorber is preferably relatively large. In this regard, the absorber and the transducer are preferably sized such that the surface area of the absorber is greater than the surface area of the transducer. As such, the absorber covers the transducer in an umbrella-like configuration. Moreover, in embodiments in which the pixel structure includes legs for supporting the transducer in a spaced-apart relationship with respect to the substrate, the absorber is preferably sized such that the absorber covers both the transducer and the legs in an umbrella-like configuration. By filling most, if not all, of the footprint of the pixel structure with the respective absorber, the focal plane array of the present invention maximizes the fill factor, thereby correspondingly maximizing the percentage of incident thermal radiation captured by the absorber.

While the pixel structure disclosed in the '194 patent addresses many of the shortcomings of conventional focal plane arrays, it is always desirable to further improve upon existing designs. In this regard, certain types of materials used to create the transducer element of many bolometers generally cause some level of a low frequency, 1/f, noise in the signal generated by passing current through the transducer element. For example, while the transducers of some bolometers are formed of vanadium oxide ($VO_x$) since it has an electrical resistance that predictably varies in a significant manner in response to changes in its temperature, $VO_x$ generates 1/f noise. Typically, the level of 1/f noise scales inversely with the square root of the volume of the transducer material used in the bolometer. Therefore, smaller area transducers tend to exhibit higher levels of 1/f noise than do larger area transducers. This 1/f noise is a drawback to the focal plane array because 1/f noise generally limits the ability of the infrared detector to effectively calibrate for other types of noise, such as spatial pattern noise, thereby removing these other types of noise from the signal generated by passing current through the transducer element. Therefore, it would be desirable to have a pixel structure that addresses the shortcomings of conventional focal plane arrays and additionally decreases 1/f noise by maximizing the volume of the transducer element in relation to the rest of the pixel structure. The pixel structure should additionally maximize the absorption characteristics of the bolometer, while minimizing the thermal loss to the substrate.

SUMMARY OF THE INVENTION

In light of the foregoing background, the present invention provides a pixel structure which typically forms one element of a focal plane array and which includes a bolometer having a detector and an insulator (e.g., thermal isolation structure) in a spaced apart relationship. The insulator includes a plurality of legs where, in one embodiment, the legs are disposed underneath the detector, so as to maximize the area of the detector and the length of the legs of the insulator and, thus, optimize the performance of the pixel structure. In this regard, maximizing the area of the detector increases the absorption efficiency of the bolometer and reduces the level of 1/f noise. Additionally, by increasing the length of the legs, such as by including serpentine legs in one embodiment, the absorption efficiency is increased, the thermal resistance of the bolometer is increased, and the thermal loss to the substrate is minimized.

In addition, the bolometer includes a resonant layer that, along with the detector and insulator, forms two resonant absorption cavities to increase the absorption efficiency of the bolometer. In this regard, the resonant layer is selected such that it is impedance matched with vacuum so that the emissivity of the bolometer approaches unity. Also, a method is provided for fabricating a pixel structure of a bolometer-based focal plane array in which the insulator is disposed underneath the detector so as to likewise facilitate maximizing the area of the detector and insulator.

Each pixel structure includes a substrate and a bolometer. The bolometer includes a detector that is made from a material that absorbs incident thermal radiation and has an electrical resistance that varies in response to changes in the temperature of the material, such as, for example, $VO_x$. The bolometer also includes an insulator that has a plurality of serpentine legs where, according to one advantageous embodiment, the legs are disposed completely underneath the detector so that the insulator extends between the detector and the substrate to support the detector in a spaced-apart relationship with respect to the substrate. Regardless of its disposition with respect to the detector, the serpentine leg of one embodiment is two-dimensional. In this regard, the serpentine leg can have a plurality of branches including a first set of branches extending in one direction and a second set of branches, interconnecting branches of the first set, extending in a separate direction different than the direction of the first set. In order to further improve the performance of the bolometer, insulator can further be adapted to reflect incident thermal radiation at least partially toward the detector. In addition to the detector and insulator, the bolometer includes the resonant layer. As stated, the resonant layer is disposed between the detector and insulator. The resonant layer is situated such that an area defined between the detector and the resonant layer forms a first resonant cavity, and an area defined between the resonant layer and the insulator forms a second resonant cavity.

As mentioned, the insulator supports the detector in a spaced-apart relationship with respect to the substrate. To support the detector in a spaced-apart relationship with respect to the substrate, the pixel structure of one advantageous embodiment includes one or more base anchors of various shapes, such as frustum shaped, that extend between the substrate and the insulator to support the insulator (and, in turn, the detector) in a spaced-apart relationship with respect to the substrate. Additionally, in a further embodiment, the pixel structure can include one or more elevation anchors of various shapes, such as frustum shaped, that extend between the insulator and detector to further support the detector in a spaced-apart relationship with respect to the substrate. In embodiments that include the anchors, the substrate and insulator, and possibly also the insulator and detector, are disposed in different planes and are at least partially separated by a gap. Also, in various embodiments the anchors can additionally serve to electrically connect the bolometer to a contact location on the pixel structure, typically within the substrate.

In operation, the detector absorbs thermal incident radiation which heats the detector. As the radiation heats the detector, the temperature of the detector changes, which causes the electrical resistance of the detector to correspondingly vary in a predetermined manner. By measuring the change in electrical resistance of the detector, such as by passing a known current therethrough, a precise measurement of the radiation absorbed by the detector can be determined.

Since the bolometer of one advantageous embodiment has an insulator with serpentine legs disposed underneath the detector, the area of the detector and the length of the legs can be maximized so as to optimize the performance of the pixel structure. For example, in order to increase the absorption characteristics of the pixel structure, the detector, which absorbs the incident thermal radiation, is preferably relatively large. By filling most, if not all, of the footprint of the pixel structure with the respective detector, the focal plane array of the present invention maximizes the fill factor. In addition, maximizing the area of the detector with respect to the footprint size of the pixel structure minimizes the level of 1/f noise since the area of the detector and level of noise are inversely proportional.

By placing the insulator between the substrate and detector and disposing the legs of the insulator underneath the detector according to one advantageous embodiment, thermal loss to the substrate can also be minimized. As previously mentioned, conventional bolometers generally include two or more legs that extend between the bolometer and the substrate and support the bolometer above the substrate and help reduce thermal loss to the substrate. Because, the legs of conventional bolometers typically extend out from edge portions of the absorber and transducer, the length of the legs are limited, which limits the thermal isolation of the bolometer. In contrast, by permitting the detector to overlie the insulating legs and/or by forming the insulating legs in a two-dimensional serpentine shape, the bolometer of the present invention can maximize the length of the legs of the insulator. Maximizing the length of the legs maximizes the thermal isolation of the detector with respect to the substrate which, combined with the absorption efficiency of the detector, increases the sensitivity and, thus, thermal resistance, of the bolometer.

The present invention also advantageously provides a method of fabricating a pixel structure having a bolometer and a plurality of thermal impedance legs. According to this method, a first sacrificial layer is initially deposited upon the substrate. The thermal impedance legs, which form the insulator, are then formed upon the first sacrificial layer, preferably in a serpentine shape.

In embodiments including a plurality of base anchors between the substrate and the thermal impedance legs, the thermal impedance legs can be formed by first creating at least one contact hole completely through the first sacrificial layer and then forming the base anchors within the contact holes, preferably in a frustum shape. The thermal impedance legs are then formed such that they are in mechanical connection with the base anchors so that the base anchors will support the thermal impedance legs in a spaced-apart relationship with respect to the substrate. In a further embodiment, the thermal impedance legs are formed by first creating the contact holes completely through the first sacrificial layer to define contact locations. Then, a first thermal insulating layer is deposited upon the first sacrificial layer and at least partially within the holes at the contact locations. Next, apertures are created through the first thermal insulating layer at the contact locations. After the apertures are created, a first electrically conductive layer is deposited upon at least a portion of the first thermal insulating layer and within the apertures. A second thermal insulating layer is then deposited upon the first thermally conductive material. In this embodiment, the first thermal insulating layer, the first electrically conductive layer and second thermal insulating layer located within the contact locations form the base anchors.

After forming the thermal impedance legs, a second sacrificial layer is deposited upon the thermal impedance legs. Next, the resonant layer is deposited upon the second sacrificial layer. In embodiments including elevation anchors, the elevation anchors, which support the detector above the insulator and electrically connect the detector and the insulator legs, is then formed. The elevation anchor is formed by first creating at least one cavity completely through the resonant layer, the second sacrificial layer and second thermal insulating layer of the thermal impedance legs to define at least one connection location on the first electrically conductive layer of the thermal impedance legs. A thermal insulating layer is then deposited upon the resonant layer and at least partially within the cavities at the connection locations, and openings are thereafter created through the thermal insulating layer at the connection locations to again expose the first electrically conductive layer. Next, a second electrically conductive layer is deposited within the openings upon the exposed first electrically conductive layer such that the second electrically conductive layer is in electrical communication with the first electrically conductive layer and at least partially extends beyond the openings.

After depositing the second sacrificial layer and resonant layer, and forming the elevation anchors (in embodiments including elevation anchors), a bolometer material, which forms the detector, is deposited upon the resonant layer, preferably completely covering the thermal impedance legs. In embodiments including base anchors, the bolometer material is preferably deposited so that the bolometer material is in electrical communication via the second electrically conductive layer with the first electrically conductive layer of the thermal impedance legs and the base anchors. After depositing the bolometer material upon the resonant layer, the first and second sacrificial layers are then removed so that the bolometer material is spaced apart from the thermal impedance legs, and the thermal impedance legs are spaced apart from the substrate.

By preferably disposing the insulator underneath the detector in the bolometer of the present invention, the area of the detector and insulator can be maximized, which allows for optimal performance of the pixel structure. As such, the absorption characteristics of the bolometer can be maximized, and 1/f noise can be minimized. Additionally, the thermal loss of the bolometer to the substrate can be reduced due to increases in the length of the insulator legs which, combined with the increased absorption characteristics, increases the thermal resistance of the bolometer. Moreover, by including the resonant layer, the absorption efficiency of the bolometer is greatly increased over conventional systems.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
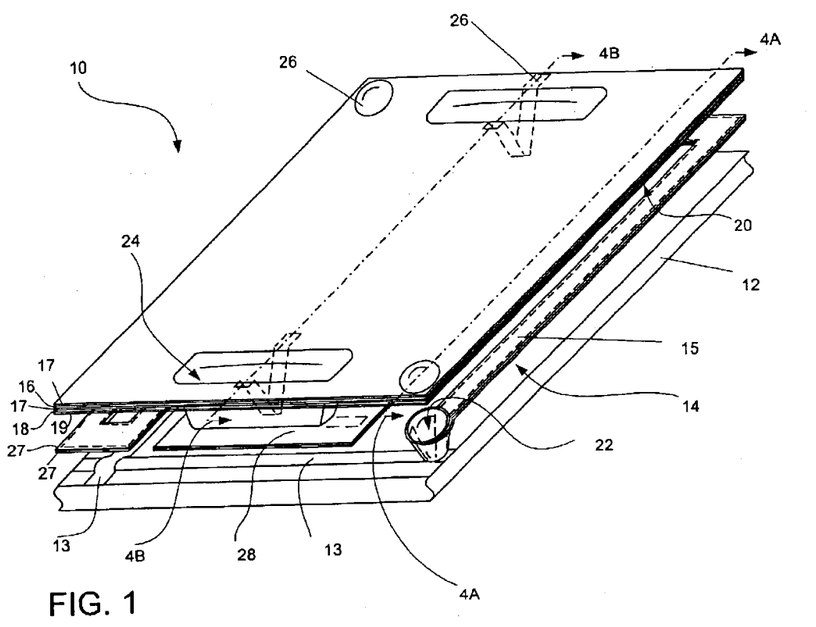
FIG. 1 is a perspective view of one pixel structure of a focal plane array according to one advantageous embodiment of the present invention.

Referring now to FIG. 1, a pixel structure 10 according to one advantageous embodiment of the present invention is illustrated. As shown, the pixel structure includes a substrate 12 and a bolometer disposed upon the substrate. As known to those skilled in the art, a focal plane array typically includes an array of pixel structures, thereby forming an uncooled infrared focal plane array. Although the array can have different sizes, such as 320 rows by 240 columns, the focal plane array of one common example includes an array of pixel structures arranged in 640 rows and 480 columns. For purposes of illustration, however, a single pixel structure is depicted with the understanding that the other pixel structures of the focal plane array can be constructed in a like fashion.

Although not illustrated, the focal plane array is typically disposed within a housing that is sealed to establish a vacuum chamber. The housing typically includes a window formed of a material that is transparent to infrared radiation such that infrared radiation incident upon the housing can be sensed by one or more pixel structures of the focal plane array. See, for example, U.S. Pat. No. 6,252,229 that describes housings and techniques for sealing the housings in which focal plane arrays are disposed, the contents of which are incorporated herein by reference.

The substrate 12 is a microelectronic substrate and, as such, is typically formed of silicon although other materials can be utilized. Circuitry is typically formed on or below the surface of the substrate in a manner known to those skilled in the art in order to properly-provide signals to and process signals that are received from the respective pixel structures, thereby permitting each pixel structure to be interrogated to determine the radiation incident thereupon. In this regard, the substrate and circuitry can be formed into a readout integrated circuit wafer. As shown in FIG. 1 in conjunction with an embodiment in which the focal plane array includes an array of pixel structures 10, the circuitry preferably includes row and column select elements 13 for permitting individual ones of the pixel structures to be addressed. As known to those skilled in the art, the circuitry can also include other circuitry disposed upon the substrate in electrical communication with the row and/or column select elements for processing the signals transmitted to or received from the respective pixel structure.

The pixel structure 10 of the focal plane array of the present invention includes an insulator 14 having legs 15 and supported in a spaced-apart relationship with respect to the substrate 12, and a detector 16 disposed above the insulator and supported in a spaced-apart relationship with respect to both the substrate and the insulator. Additionally, the pixel structure includes a resonant layer 18 disposed between the insulator and the detector. Since the insulator is preferably disposed underneath the detector, the area of the insulator and detector can each be maximized to optimize the performance of the pixel structure. For example, the absorption characteristics of the detector can be maximized and/or the thermal loss to the substrate can be minimized in order to increase the responsiveness of the respective pixel structure. And since the resonant layer is disposed between the insulator and the detector, two resonant cavities can be formed which increase the thermal absorption efficiency of the pixel structure.

Figure 2:
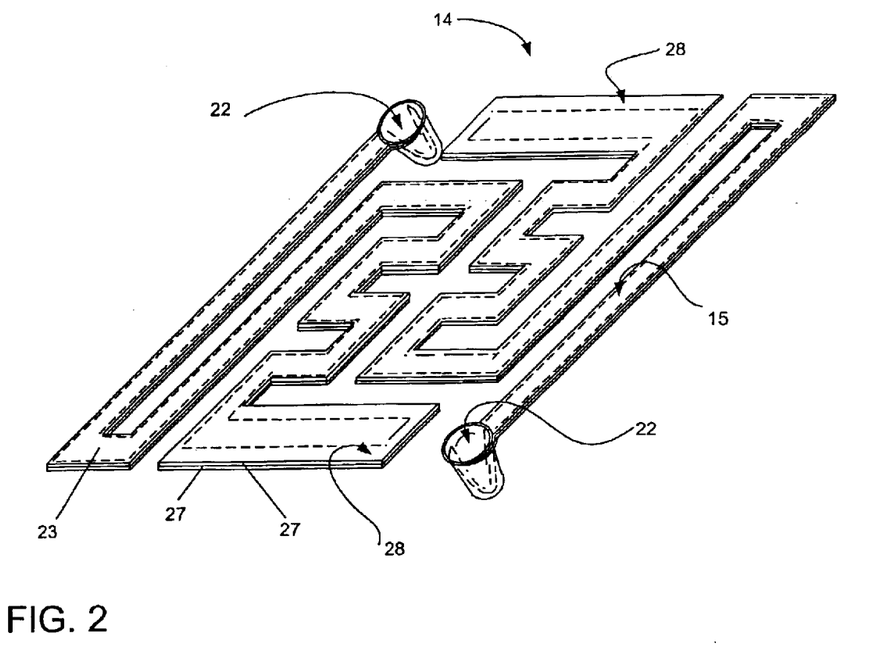
FIG. 2 is a perspective view of the insulator of the bolometer illustrated in FIG. 1.
Figure 3:
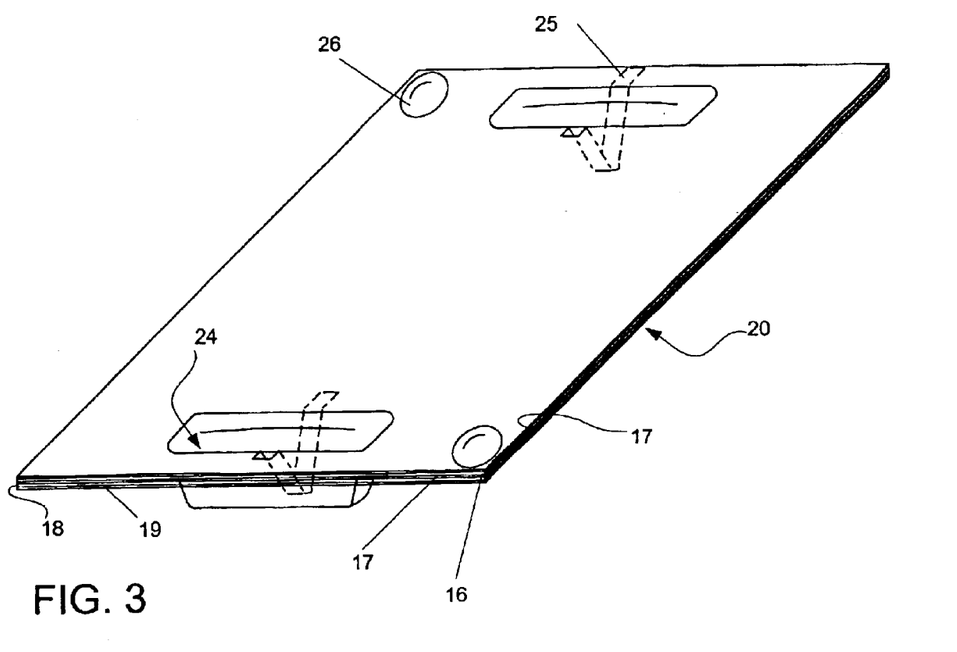
FIG. 3 is a perspective view of the detector of the bolometer illustrated in FIG. 1.

The detector 16 is formed of a material that absorbs incident thermal radiation and has an electrical resistance that varies in response to changes in its temperature. For example, the detector of one advantageous embodiment is formed of $VO_x$ since it has an electrical resistance that predictably varies in a significant manner in response to changes in its temperature. As shown, the insulator 14 is preferably disposed underneath the detector and serves to support the detector. As described below, the insulator is typically formed of an electrically insulating material 27, such as $SiO_2$, and shaped so as to help thermally isolate the detector. As illustrated in FIG. 2, in a preferred embodiment, the insulator is a composite structure formed of an electrically conductive material, such as titanium or nichrome, that provides electrical contact between the detector and circuitry disposed upon the substrate. The electrically conductive material is disposed upon an electrically insulating layer, such as $SiO_2$. Also, as illustrated and described below, the insulator can include a second electrically insulating layer, such as a second layer of $SiO_2$ over the electrically conductive material to provide additional isolation for the electrically conductive material and the signals propagating therealong. While the material that forms the insulator is electrically insulating, the material is also preferably selected, and the insulator is preferably shaped, so as to assist in thermally isolating the detector from the substrate 12, thereby reducing the thermal loss to the substrate. In this regard, the insulator is designed to define a relatively long path from the detector to the substrate, thereby increasing the thermal isolation therebetween. Additionally, in one embodiment, the insulator is selected so that it at least partially reflects incident thermal radiation. In this embodiment, the insulator is capable of at least partially reflecting the thermal radiation due to traces of electrically conductive material within the insulator. Also in this embodiment, the insulator defines the bottom side of the optical cavity, and the detector defines the top side of the cavity as will be described hereinafter. For example, the insulator is typically formed of $SiO_2$ that is shaped to define a plurality of legs 15, each having a serpentine pattern in order to increase the thermal isolation of the detector and provide reflection of the thermal radiation, as described below. In this regard, the reflection efficiency is high due to the close spacing (approximately one micron) of the serpentine legs. The insulator can be formed of other electrically insulating materials such as silicon nitride, however, without departing from the spirit and scope of the present invention. As shown in FIGS. 1 and 3, the detector can also be covered on both sides with additional layers of insulating material 17 in order to further protect the detector. Like the insulator, the layers of insulating material that cover the detector are preferably formed of an electrically insulating material that is preferably selected and shaped to be relatively thermally insulating, such as $SiO_2$. For purposes of description, the detector as well as the surrounding insulating layers will collectively be referenced as the detector layer 20.

Figure 4A:
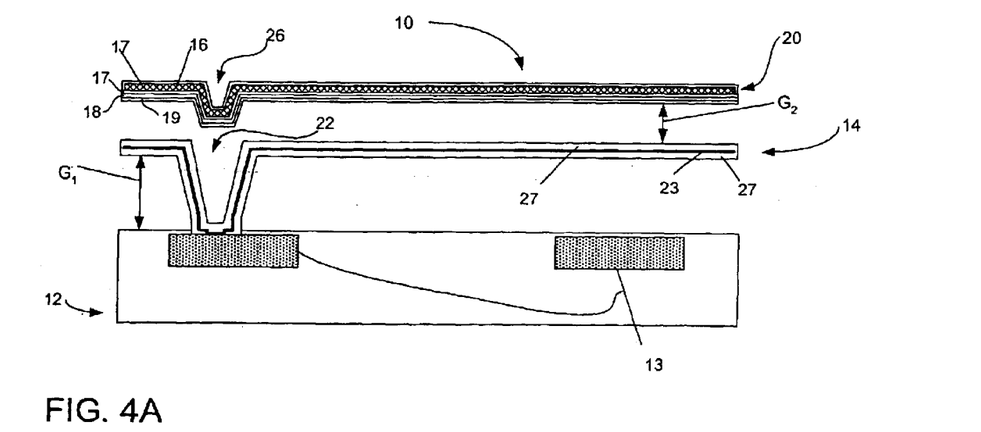
FIG. 4A is a side cross-sectional view of the pixel structure of FIG. 1 taken across line 4A—4A, highlighting the insulator and one base anchor, and depicting only those portions of the pixel structure located at the cross-section plane.
Figure 4B:
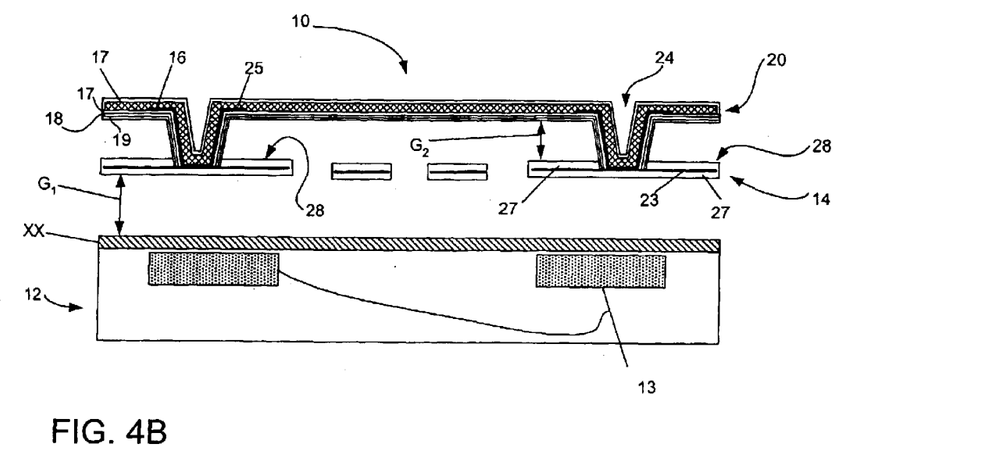
FIG. 4B is a side cross-sectional view of the pixel structure of FIG. 1 taken across line 4B—4B, highlighting the detector and elevation anchors, and depicting only those portions of the pixel structure located at the cross-section plane.

Referring to FIGS. 4A and 4B, the insulator 14 is spaced from the underlying substrate 12, typically by an air gap $G_1$, and the detector layer 20 is separated from the insulator layer by an air gap $G_2$. While the gap $G_2$ can have different sizes without departing from the spirit and scope of the present invention, the gap $G_2$ is typically about 1 micron. In particular, the gap $G_2$ is typically sized so that when combined with the detector layer 20 the total optical path is about one quarter of the wavelength of radiation that the bolometer is designed to detect, as described in more detail below.

The insulator 14 can be spaced from the substrate 12 in a variety of manners. For example, the insulator can include a pair of legs that are angled or sloped downwardly to the substrate. Alternatively, as illustrated in FIGS. 2 and 4A, the legs 15 of the insulator can extend to respective base anchors 22 that extend outwardly in a frustum shape from the substrate so as to support the insulator above the substrate. Like the insulator, the base anchors are typically a composite structure formed of an electrically conductive material, such as titanium or nichrome, extending through an electrically insulating material, such as $SiO_2$, in order to provide electrical contact between the insulator and circuitry disposed upon the substrate, as described in more detail below. By using the insulator to thermally isolate the detector element from the substrate, the thermal loss from the detector to the substrate is reduced.

In the embodiment wherein the insulator 14 is a composite structure, the insulator includes traces 23 of the electrically conductive material that are electrically connected to respective ones of the base anchors 22 and, more particularly, to the electrically conductive portion of each base anchor, thereby electrically connecting the insulator and, as described below, the detector 16 to the circuitry disposed upon the substrate 12. The conductive traces are generally deposited upon an insulating layer and, as illustrated, the conductive traces can also be covered with another insulating layer in order to protect them and the signals propagating therealong. As described below, the insulator including the conductive traces preferably define a pair of serpentine legs 15. The conductive traces of the serpentine legs can therefore be controlled to pass current through the detector such that the resistance of the detector can be correspondingly monitored, thereby providing a measure of the radiation incident upon the bolometer.

In order to minimize the thermal loss from the detector 16 to the substrate 12 and to correspondingly maximize the responsiveness of the bolometer, the detector is preferably thermally isolated from the underlying substrate. In order to provide thermal isolation, the insulator 14 that supports the detector preferably has legs 15 that define a serpentine pattern underneath the detector and extend from the detector the respective base anchors 22. See FIG. 2. As used herein, serpentine refers to a winding pattern that changes direction two or more times. For example, the serpentine pattern can consist of a plurality of branches having a first set of branches extending in a first direction, and a second set of branches that interconnect respective branches of the first set and that extend in a second direction that is different than the first direction, such as by being perpendicular to the first direction. In this regard, although the insulator of the illustrated embodiment includes one type of serpentine pattern of meandering legs, the insulator can define more intricate and sinuous serpentine patterns, if so desired. As will be apparent to those skilled in the art, the serpentine pattern of the legs will provide significant thermal isolation for the detector since the length of the path that heat must traverse to pass between the detector and the substrate is much greater than the cross-sectional size of the path, i.e., the length of the legs is much greater than the cross-sectional dimensions of the legs.

According to one embodiment of the present invention, the detector 16 is disposed in a spaced-apart relationship with respect to the insulator 14 by means of one or more elevation anchors 24. As shown in FIGS. 3 and 4B, for example, the bolometer can include multiple elevation anchors extending outwardly from the insulator in an elliptical frustum shape in order to support the detector in a spaced-apart relationship with respect to the insulator. However, the bolometer can include additional elevation anchors, if so desired. Typically, however, the bolometer includes a pair of elevation anchors disposed at opposite sides of the detector and connected to different ones of the serpentine legs. Like the base anchors 22 and the insulator, the elevation anchors are typically a composite structure formed of an electrically conductive material, such as titanium or nichrome, extending through an electrically insulating material, such as $SiO_2$, in order to provide electrical contact between the detector and insulator and, thus, the substrate. To provide electrical connection between the detector and the circuitry disposed upon the substrate, the electrically conductive material in the elevation anchors is electrically connected to the electrically conductive material in the insulator. The electrically conductive material in the insulator is, in turn, electrically connected to the electrically conductive material in the base anchors. And the electrically conductive material in the base anchors is electrically connected to the circuitry on the substrate. Thus, current can be controllably passed through the detector by means of the elevation anchors.

As described above with respect to the spacing of the insulator 14 from the underlying substrate 12, the detector 16 can be spaced at a number of distances from the insulator. In one advantageous embodiment, however, the detector is spaced by a gap $G_2$ of about 1 micron from the insulator. See FIGS. 4A and 4B. More particularly, the combined thickness of gap $G_2$ and the detector layer 20 has a spacing at about a quarter of the wavelength of the radiation that the absorber is designed to preferentially absorb, such as about 2 to 3 microns for an absorber designed to preferentially absorb infrared radiation having a wavelength of 8 to 14 microns.

To increase the thermal absorption efficiency of the detector 16, the pixel structure 10 includes a resonant layer 18 disposed between the detector and the insulator 14. As shown, the resonant layer can be disposed below insulating layer 17 underneath the detector to thereby protect the top surface of the resonant layer. The resonant layer preferably includes an additional layer of insulating material 19 that, when combined with insulating layer 17 below the detector, protects both surfaces of the resonant layer. The resonant layer can comprise any of a number of materials, such as titanium or nichrome, but the resonant layer preferably has a sheet resistance between about 150.3 and about 225.7 Ω/square, and most preferably about 188 Ω/square.

As is known to those skilled in the art, freestanding thin films having a sheet resistance of 188 Ω/square are impedance matched to a vacuum and, therefore, are capable of absorbing approximately 50% of the incident thermal radiation. In this regard, with the addition of the resonant layer 18, two resonant cavities, which terminate at the resonant layer, are formed in the pixel structure 10. The first resonant cavity consists of the insulating layers 17 surrounding the detector 16 and the detector itself. And the insulating layer 19 on the bottom surface of the resonant layer, when combined with the air gap $G_2$ and the top layer of electrically insulating material 27 of the insulator 14, form the second resonant cavity.

Figure 5:
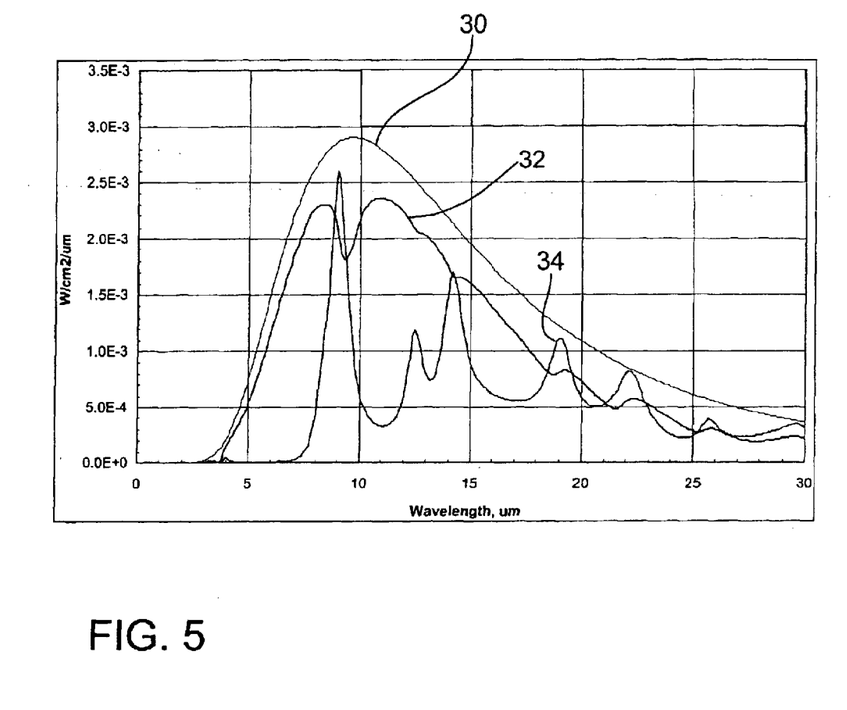
FIG. 5 is a graph illustrating the increase of thermal absorption of the pixel structure with the addition of a resonant layer, according to one embodiment of the present invention.

With reference to FIG. 5, the addition of the resonant layer significantly improves the absorption efficiency of the detector when compared to the ideal of 300k black body radiation (line 30). In this regard, line 32 represents the spectral absorption of the pixel structure including the resonant layer, while line 34 represents the spectral absorption of the same pixel structure without the resonant layer. As the graph illustrates, the overall absorption efficiency increases by approximately twice that of the pixel structure without the resonant layer. In fact, in the preferred embodiment, the calculated thermal emissivity, averaged over the eight to fourteen micron spectral band, improved from 0.36 for the pixel structure without the resonant layer, to 0.80 for the pixel structure of the present invention including the resonant layer.

In operation, radiation, such as IR radiation having a wavelength of 8 to 12 microns, that is incident upon the detector 16 causes the temperature of the detector to increase. This increased temperature causes the electrical resistance of the detector to correspondingly change. Current can then be passed through the detector via the circuitry disposed upon the substrate 12, the base anchors 22, the conductive traces 23 and the elevation anchors 24. In a typical embodiment of a focal plane array in which the circuitry includes row select elements and column select elements 13, a known voltage can be applied to the row select element in order to induce current to flow through each pixel structure in the selected row. By measuring the changes in electrical resistance of the detector, the circuitry or other associated processing elements can precisely determine the radiation incident upon the detector. For example, by separately measuring the current flowing through the detectors of the bolometers of the selected row of pixel structures and by adjusting the measured current by a predefined offset to compensate for differences between the bolometers, a measure of the resistance of the respective detectors and, in turn, a measure of the radiation incident upon the respective detectors can be obtained. By analyzing the radiation incident upon each of an array of pixel structures, a two-dimensional image of the incident radiation can be constructed.

As stated, some infrared radiation that is incident upon the bolometer passes through and is not absorbed by the detector 16. This radiation will be reflected by the insulator towards the detector. To maximize absorption of the detector, the resonant layer 18 creates two resonant cavities in the bolometer between the top surface of the detector layer and the electrically conductive traces 23 in the insulator 14. In this regard, a portion of the radiation that passes through the detector will be reflected by the resonant layer and resonate in the first resonant cavity while the detector absorbs at least a portion of the radiation on subsequent passes through the detector. Any portion of the reflected radiation that also passes through the resonant layer will resonate in the second resonant cavity. As the radiation resonates in the second resonant cavity, at least a portion of the radiation will pass back through the resonant layer into the first resonant cavity and be absorbed by the detector.

Since the bolometer of the pixel structure 10 of the present invention includes the detector 16 disposed above the insulator 14 as described above, the detector and insulator can be constructed to maximize its absorption characteristics while simultaneously minimizing the thermal loss to the substrate 12 in order to correspondingly increase the responsiveness of the bolometer. As such, even though the detector is typically relatively thin, such as about 4,000 angstroms or less, the detector is generally constructed to have a relatively large surface area for receiving the radiation. The large surface area, in turn, also decreases the 1/f noise which, as previously mentioned, scales inversely with the surface area of the detector. Additionally, by disposing the insulator below the detector, the area of the insulator can be maximized. As illustrated, for example, the detector and insulator are preferably sized such that the surface area of the detector and insulator almost completely cover the pixel footprint. More particularly, the detector preferably covers the entire insulator, including the legs 15 and base anchors 22 that suspend the insulator above the substrate 12. By enlarging the dimensions of the detector over the insulator, the array of pixel structures of the present invention can be designed to advantageously maximize the fill factor to 80% or more in some embodiments. Since the size of the detector can be maximized so as to reduce 1/f noise, the pixel structure of the present invention can also be utilized to fabricate focal plane arrays having pixel structures that are smaller than a conventional pixel structure that is 50 microns square. For example, the pixel structures of the present invention can be 25 microns square or even smaller, thereby permitting more pixel structures to be fabricated from a wafer of a given size and permitting the resolution of the resulting detector array to be, improved.

Figure 6:
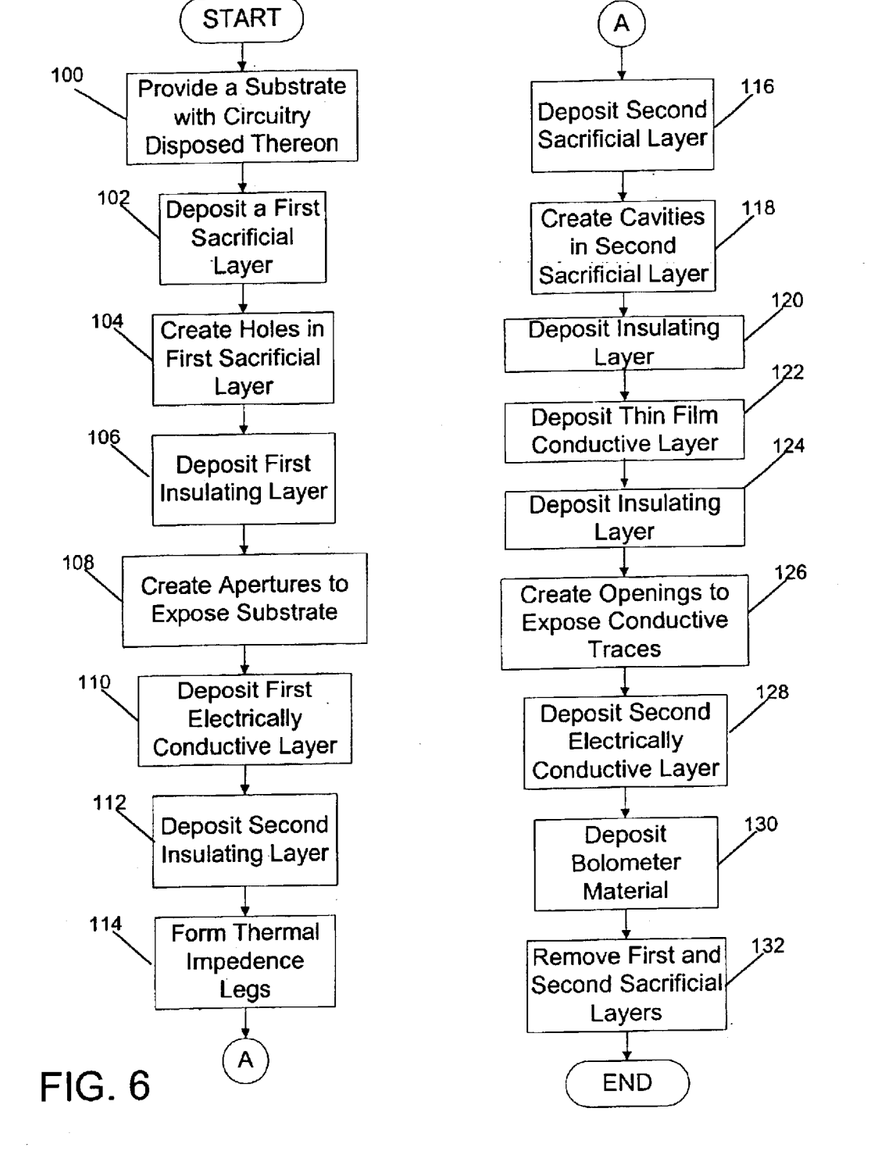
FIG. 6 is a flow chart illustrating the operations performed to fabricate the pixel structure having a bolometer according to one embodiment of the present invention.

As shown in FIG. 6, the pixel structure 10 of the present invention is typically fabricated by a unique series of conventional microelectronic fabrication steps. In this regard, a substrate 12 having circuitry formed thereon is provided as shown in block 100. A first sacrificial layer is then deposited upon the substrate. See block 102. While the first sacrificial layer can be formed of a variety of materials, the first sacrificial layer is typically formed of a polyimide. Since the first sacrificial layer will define the gap $G_1$ between the substrate and the insulator 14, the first sacrificial layer typically has a thickness of about 1.5 microns as described above. After photolithographically patterning the first sacrificial layer, the first sacrificial layer is etched to define a plurality of contact holes through which the substrate is exposed such that electrical contact can subsequently be made with the circuitry carried by the substrate, as described below. See block 104. The insulator, having a plurality of impedance legs 15, and base anchors 22 are then formed upon the first sacrificial layer and within the contact holes defined by the first sacrificial layer. For example, the insulator is typically formed by first depositing a thin layer of thermal insulating material, such as 0.1 to 0.2 micron thick $SiO_2$, on the first sacrificial layer and at least partially within the contact holes as shown in block 106. Typically, the thermal insulating layer is deposited by plasma enhanced chemical vapor deposition (PECVD). Then, apertures are etched through the thermal insulating-layer within the contact holes to again expose the substrate. See block 108. A layer of electrically conductive material, such as 0.05 to 0.1 micron thick titanium or nichrome, is then deposited upon the first thermal insulating layer and within the apertures to form an electrical connection with the circuitry disposed upon the substrate as shown in block 110. Then, a second thermal insulating layer, such as 0.1 to 0.2 micron thick $SiO_2$, is deposited upon the electrically conductive material, again typically by PECVD. See block 112. In this regard, the thermal insulating layers and electrically conductive layer form a composite structure that make up the insulator, including the conductive traces 23, and base anchors, which are formed within the contact holes and apertures. After the insulator and base anchors are formed, the thermal impedance legs are photolithographically patterned to define the desired shape, i.e., to define the serpentine shape 15. See block 114.

After the thermal impedance legs 15 are patterned, a second sacrificial layer is then deposited upon the insulator 14. See block 116. As a byproduct of depositing the second sacrificial layer on the insulator, the second sacrificial layer can, but need not, conform to the shape of the insulator and base anchors 22, forming divots 26 in the second sacrificial layer and thereafter in all layers deposited over the second sacrificial layer, as described below. As described above, the second sacrificial layer is typically comprised of polyimide having a thickness of 1 micron, although a variety of other materials having a number of different thicknesses can be utilized. The second sacrificial layer is then photolithographically patterned and etched to form a plurality of cavities through which the conductive traces 23 in the insulator are exposed to thereby define a plurality of connection locations 28. See block 118. Next, the resonant layer 18, the detector layer 20, and elevation anchors 24, are formed upon the second sacrificial layer. In this regard, the detector and elevation anchors can be formed by first depositing, generally by PECVD, a thermal insulating layer, such as 0.05 micron thick $SiO_2$, on the second sacrificial layer and at least partially within the cavities, as shown in block 120.

Then, the resonant layer, comprising an electrically conductive material, is deposited on the thermal insulating layer within the cavities. See block 122. Another thermal insulating layer, such as another 0.05 micron thick $SiO_2$ layer, is then deposited, generally by PECVD, on the resonant layer. See block 124. Next, openings are etched through the thermal insulating layers surrounding the resonant layer, and the resonant layer, to again expose the conductive traces 23 in the insulator. See block 126. A thin layer of electrically conductive material, such as 0.05 to 0.10 micron thick titanium or nichrome, is next deposited and thereafter photolithographically patterned and etched to form electrical connectors 25 at the connection locations 28. See block 128.

After the electrical connectors 25 are formed, bolometer material, which forms the detector 16, is deposited on the thermal insulating layer previously deposited upon the resonant layer, and over and in electrical contact with the electrical connectors, as illustrated in block 130. For example, in one embodiment, the bolometer material comprises a 0.20 to 0.40 micron thick layer of $VO_x$ and is deposited by reactive sputtering. After the bolometer material is deposited, the bolometer material is photolithographically patterned and etched through to define two ends of the pixel structure 10 and delineate one pixel structure from the next in the focal plane array. To seal the bolometer material, another thermal insulating layer can be deposited, typically by PECVD, on the bolometer material, such as a 0.5 micron thick layer of $SiO_2$. In this regard, the thermal insulating layers, electrically conductive layer and bolometer material form a composite structure that make up the detector layer 20, and elevation anchors 24, which are formed within the cavities and openings. Delineation of the pixel structure is then completed by etching through the insulating layers surrounding the bolometer material at the end points of the pixel structure. The first and second sacrificial layers are then removed, such as by oxygen plasma etching that converts the polyimide into carbon dioxide. See block 132.

As such, the pixel structure 10 of the present invention can be efficiently fabricated by a unique combination of microelectronic fabrication steps. In addition, by disposing the insulator 14, including legs 15, underneath the detector 16, the area of the detector and legs of the insulator can be maximized to optimize performance of the pixel structure, such as by lowering the 1/f noise generated by the detector, enhancing the absorption characteristics of the detector and minimizing the thermal loss to the substrate, thereby maximizing the responsiveness of the pixel structure. Accordingly, the pixel structure of the bolometer-based uncooled focal plane array of the present invention can provide a precise measure of the radiation incident upon the absorber in a timely and responsive manner. Additionally, the pixel structure of the bolometer-based uncooled focal plane array provides a resonant layer disposed between the detector and insulator. By including the resonant layer, the absorption efficiency of the pixel structure greatly increases over conventional pixel structures.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A pixel structure of a bolometer-based focal plane array for detecting radiation comprising:
   a substrate; and
   a bolometer comprising:
      a detector supported in a spaced-apart relationship with respect to said substrate, said detector adapted to absorb incident thermal radiation, wherein said detector has an electrical resistance that varies in response to changes in the temperature of said detector;
      an insulator comprising a plurality of serpentine legs disposed completely underneath said detector, wherein said insulator extends between said detector and said substrate to support said detector in a spaced-apart relationship with respect to said substrate; and
      a resonant layer disposed between said detector and said insulator, wherein said resonant layer is disposed such that an area defined between said detector and said resonant layer forms a first resonant cavity, and wherein said resonant layer is disposed such that an area defined between said resonant layer and said insulator forms a second resonant cavity.

2. A pixel structure according to claim 1 wherein said detector and said insulator are disposed in respective planes and are at least partially separated by a gap.

3. A pixel structure according to claim 2 wherein said substrate and said insulator are disposed in respective planes and are at least partially separated by a gap.

4. A pixel structure according to claim 1 wherein said detector comprises vanadium oxide.

5. A pixel structure according to claim 1 further comprising a plurality of base anchors extending between said substrate and said insulator, wherein said base anchors support said insulator in a spaced-apart relationship with respect to said substrate.

6. A pixel structure according to claim 5 wherein said base anchors are frustum shaped.

7. A pixel structure according to claim 5 wherein said bolometer further comprises at least one elevation anchor extending between said detector and said insulator, wherein said at least one elevation anchor supports said detector in a spaced-apart relationship with respect to said insulator.

8. A pixel structure according to claim 7 wherein said at least one elevation anchor is frustum shaped.

9. A pixel structure according to claim 1 wherein said insulator further at least partially reflects incident thermal radiation at least partially toward said detector.

10. A pixel structure according to claim 1 wherein said plurality of serpentine legs of said insulator comprise a plurality of branches comprised of a first set of branches extending in a first direction and a second set of branches that interconnect respective branches of the first set and that extend in a second direction that is different than the first direction.

11. A pixel structure comprising:
    a substrate; and
    a bolometer comprising:
       a detector supported in a spaced-apart relationship with respect to said substrate, said detector adapted to absorb incident thermal radiation, wherein said detector has an electrical resistance that varies in response to changes in the temperature of said detector;
       an insulator comprising a plurality of two-dimensional serpentine legs extending between said detector and said substrate to support said detector in a spaced-apart relationship with respect to said substrate; and
       a resonant layer disposed between said detector and said insulator, wherein said resonant layer is disposed such that an area defined between said detector and said resonant layer forms a first resonant cavity, and wherein said resonant layer is disposed such that an area defined between said resonant layer and said insulator forms a second resonant cavity.

12. A pixel structure according to claim 11 wherein said insulator is disposed completely underneath said detector.

13. A pixel structure according to claim 11 wherein said two-dimensional serpentine legs of said insulator comprise a plurality of branches comprised of a first set of branches extending in a first direction and a second set of branches that interconnect respective branches of the first set and that extend in a second direction that is different than the first direction.

14. A pixel structure according to claim 11 wherein said detector and said insulator are disposed in respective planes and are at least partially separated by a gap.

15. A pixel structure according to claim 14 wherein said substrate and said insulator are disposed in respective planes and are at least partially separated by a gap.

16. A pixel structure according to claim 11 wherein said detector comprises vanadium oxide.

17. A pixel structure according to claim 11 further comprising a plurality of base anchors extending between said substrate and said insulator, wherein said base anchors support said insulator in a spaced-apart relationship with respect to said substrate.

18. A pixel structure according to claim 17 wherein said base anchors are frustum shaped.

19. A pixel structure according to claim 17 wherein said bolometer further comprises at least one elevation anchor extending between said detector and said insulator, wherein said at least one elevation anchor supports said detector in a spaced-apart relationship with respect to said insulator.

20. A pixel structure according to claim 19 wherein said at least one elevation anchor is frustum shaped.

21. A pixel structure according to claim 11 wherein said insulator further at least partially reflects incident thermal radiation at least partially toward said detector.

22. A method of fabricating a pixel structure comprising:

depositing a first sacrificial layer upon a substrate;

forming a plurality of thermal impedance legs upon the first sacrificial layer;

depositing a second sacrificial layer upon the thermal impedance legs;

depositing a resonant layer upon the second sacrificial layer, wherein the resonant layer comprises an electrically conductive material;

depositing a bolometer material upon the resonant layer, wherein the bolometer material is adapted to absorb incident thermal radiation, wherein the bolometer material has an electrical resistance that varies in response to changes in the temperature of the bolometer material, and wherein the bolometer material is deposited such that an area defined between the bolometer material and the resonant layer forms a first resonant cavity; and removing the first and second sacrificial layers such that the bolometer material is spaced-apart from the substrate, wherein the second sacrificial layer is removed such that an area defined between the thermal impedance legs and the resonant layer forms a second resonant cavity.

23. A method according to claim 22 wherein depositing the bolometer material comprises depositing the bolometer material such that the bolometer material completely covers the thermal impedance legs following the removal of the first and second sacrificial layers.

24. A method according to claim 22 wherein forming the thermal impedance legs comprises forming the plurality of thermal impedance legs in a serpentine shape.

25. A method according to claim 24 wherein forming the thermal impedance legs comprises forming the plurality of thermal impedance legs in a two-dimensional serpentine leg shape having a plurality of branches comprised of a first set of branches extending in a first direction and a second set of branches that interconnect respective branches of the first set and that extend in a second direction that is different than the first direction.

26. A method according to claim 22 wherein forming the thermal impedance legs comprises:

creating a plurality of contact holes completely through the first sacrificial layer;

forming a plurality of base anchors within the contact holes; and forming the plurality of thermal impedance legs upon the first sacrificial layer and in mechanical connection with the base anchors such that the base anchors support the thermal impedance legs in a spaced-apart relationship with respect to said substrate when the first sacrificial layer is removed.

27. A method according to claim 26 wherein forming the base anchors comprises forming the plurality of base anchors in a v-shape in cross-section.

28. A method according to claim 22 wherein forming the thermal impedance legs comprises:

creating a plurality of holes completely through the first sacrificial layer to thereby define a plurality of contact locations;

depositing a first thermal insulating layer upon the first sacrificial layer and at least partially within the holes at the contact locations;

creating a plurality of apertures through the first thermal insulating layer at the contact locations;

depositing a first electrically conductive layer upon at least a portion of the first thermal insulating layer and within the apertures; and depositing a second thermal insulating layer upon the first thermally conductive material, wherein depositing the first thermal insulating layer, the first electrically conductive layer and second thermal insulating layer at the contact locations forms a plurality of base anchors.

29. A method according to claim 28 wherein said depositing the bolometer material comprises depositing the bolometer material such that the bolometer material is in electrical communication with said first electrically conductive layer.

30. A method according to claim 29 further comprising forming an electrical connector between the electrically conductive layer and the bolometer material before depositing the bolometer material, wherein forming the electrical connector comprises:

creating at least one cavity completely through the resonant layer, the second sacrificial layer and second thermal insulating layer to thereby define at least one connection location on the first electrically conductive layer;

depositing a thermal insulating layer upon the resonant layer and at least partially within the at least one cavity at the at least one connection location;

creating at least one opening through the thermal insulating layer at the at least one connection location to thereby expose the first electrically conductive layer; and depositing a second electrically conductive layer within the opening upon the exposed first electrically conductive layer such that the second electrically conductive layer is in electrical communication with the first electrically conductive layer and at least partially extends beyond the opening such that when the bolometer material is deposited upon the second sacrificial layer the bolometer material is in electrical communication with the second electrically conductive material.

* * * * *

UNITED STATES PATENT AND TRADEMARK OFFICE
CERTIFICATE OF CORRECTION

PATENT NO. : 6,891,161 B2
DATED : May 10, 2005
INVENTOR(S) : Ionescu et al.

It is certified that error appears in the above-identified patent and that said Letters Patent is hereby corrected as shown below:

Column 13,
Line 33, "to be, improved" should read -- to be improved --.
Line 60, "thermal insulating-layer" should read -- thermal insulating layer --.

Signed and Sealed this

Eleventh Day of October, 2005

JON W. DUDAS
*Director of the United States Patent and Trademark Office*